US012610679B2

(12) United States Patent
Sato et al.

(10) Patent No.: US 12,610,679 B2
(45) Date of Patent: Apr. 21, 2026

(54) SEMICONDUCTOR LIGHT-EMITTING DEVICE

(71) Applicant: STANLEY ELECTRIC CO., LTD., Tokyo (JP)

(72) Inventors: Shunichi Sato, Tokyo-to (JP); Naochika Horio, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 325 days.

(21) Appl. No.: 18/319,806

(22) Filed: May 18, 2023

(65) Prior Publication Data

US 2023/0411439 A1 Dec. 21, 2023

(30) Foreign Application Priority Data

May 23, 2022 (JP) ................................. 2022-083626

(51) Int. Cl.
*H10H 29/14* (2025.01)
(52) U.S. Cl.
CPC ................................. *H10H 29/142* (2025.01)
(58) Field of Classification Search
CPC .... H10H 29/142; H10H 20/857; H10H 29/14; H10H 20/831
See application file for complete search history.

(56) References Cited

U.S. PATENT DOCUMENTS 8,241,932 B1 * 8/2012 Yu ....................... H01L 25/0753
438/455
10,487,987 B2 * 11/2019 Jiang ......................... F21V 3/02
(Continued)

FOREIGN PATENT DOCUMENTS

CN 108242483 A 7/2018
JP 2001044498 A 2/2001
(Continued)

OTHER PUBLICATIONS

Taiwanese Office Action dated Nov. 5, 2024, issued in counterpart Taiwanese Application No. 112118741.
(Continued)

*Primary Examiner* — Victor A Mandala
(74) *Attorney, Agent, or Firm* — Holtz, Holtz & Volek PC

(57) ABSTRACT

A semiconductor light-emitting device includes a translucent substrate, a row of light-emitting elements on the substrate, an insulating layer, and first and second electrode pads. Each light-emitting element includes a first semiconductor layer of a first conductivity type formed on the substrate, a light-emitting layer formed on the first semiconductor layer, a second semiconductor layer of opposite conductivity type formed on the light-emitting layer, a first electrode on the first semiconductor layer, and a second electrode on the second semiconductor layer. The insulating layer covers the light-emitting elements so as to form a first opening and a second opening. The first opening exposes the first electrode of the light-emitting element in one end side of the row of light-emitting elements. The second opening exposes the second electrode of the light-emitting element in another end side of the row of light-emitting elements. The first electrode pad covers the first opening and is formed from the first opening over one region on the insulating layer, and is electrically connected to the first electrode. The second electrode pad covers the second opening and is formed from the second opening over another region spaced from the one region on the insulating layer, and is electrically connected to the second electrode.

11 Claims, 12 Drawing Sheets

(56) References Cited

U.S. PATENT DOCUMENTS

| | | | | |
|---|---|---|---|---|
| 11,538,849 | B2* | 12/2022 | Cok ........................ | H10H 20/83 |
| 2015/0340579 | A1* | 11/2015 | Seo ........................ | H10H 29/10 |
| | | | | 257/98 |
| 2016/0365382 | A1* | 12/2016 | Seo ........................ | H10H 20/01 |
| 2017/0288088 | A1* | 10/2017 | Won Cheol ............ | H10H 20/84 |
| 2018/0182931 | A1 | 6/2018 | Lee et al. | |
| 2020/0219857 | A1* | 7/2020 | Park ........................ | F21K 9/238 |
| 2021/0066261 | A1* | 3/2021 | Makita .................. | H01R 12/61 |
| 2021/0391379 | A1* | 12/2021 | Kuo .................... | H01L 25/0753 |
| 2022/0268693 | A1* | 8/2022 | Yasuda .............. | G01N 33/0027 |
| 2023/0215990 | A1* | 7/2023 | Oh ........................ | H10H 20/841 |
| | | | | 257/91 |
| 2023/0230968 | A1* | 7/2023 | Lee ........................ | H01L 25/167 |
| | | | | 257/91 |
| 2024/0213432 | A1* | 6/2024 | Yang ................... | H10H 20/858 |
| 2024/0387770 | A1* | 11/2024 | Baek ................... | H10H 20/812 |

FOREIGN PATENT DOCUMENTS

| | | | | | |
|---|---|---|---|---|---|
| JP | 2003110148 | A | 4/2003 | | |
| JP | 2004006582 | A | 1/2004 | | |
| JP | 2016012707 | A | 1/2016 | | |
| TW | 202147642 | A | 12/2021 | | |
| TW | 202207491 | A | 2/2022 | | |
| WO | WO-2016186667 | A1 * | 11/2016 | ......... | H10H 20/8506 |

OTHER PUBLICATIONS

Taiwanese Office Action dated Oct. 26, 2023, issued in counterpart Taiwanese Application No. 112118741.

Japanese Office Action (and an English language translation thereof) dated Jan. 13, 2026, issued in counterpart Japanese Application No. 2022-083626.

* cited by examiner

16M

15M

14M

12

SEMICONDUCTOR LIGHT-EMITTING DEVICE

BACKGROUND OF THE INVENTION

1. Technical Field

The present invention relates to a semiconductor light-emitting device including light-emitting elements.

2. Description of the Related Art

Recently, various types of light-emitting elements have been developed with diversification of a light-emitting device. For example, a light-emitting device in which a plurality of light-emitting elements are connected has been disclosed. JP-A-2004-06582 discloses a light-emitting device that includes a plurality of light-emitting elements mutually connected in series via a wire on a substrate, an electrode pad disposed adjacent to the light-emitting element in one end side of the plurality of light-emitting elements, and an electrode pad disposed adjacent to the light-emitting element in the other end side of the plurality of light-emitting elements.

SUMMARY OF THE INVENTION

In the light-emitting device disclosed in JP-A-2004-06582, the electrode pads are disposed in regions different from the region in which the plurality of light-emitting elements are disposed on the substrate. Therefore, the size of the light-emitting device increases, and this is one of the problems.

Additionally, in the light-emitting device disclosed in JP-A-2004-06582, the plurality of light-emitting elements are connected in series each via the wire. Therefore, when a current flows from one light-emitting element to the other light-emitting element in the mutually adjacent light-emitting elements, the current distribution is partially unbalanced between the light-emitting elements, and this is one of the problems.

The present invention has been made in consideration of the above problems, and an object of the present invention is to provide a semiconductor light-emitting device that includes a plurality of light-emitting elements and allows a uniform distribution of a current flowing in the light-emitting elements.

A semiconductor light-emitting device according to the present invention includes a translucent substrate, a plurality of light-emitting elements, an insulating layer, a first electrode pad, and a second electrode pad. The plurality of light-emitting elements are disposed in a row on the substrate. Each of the plurality of light-emitting elements includes a first semiconductor layer, a light-emitting layer, a second semiconductor layer, a first electrode, and a second electrode. The first semiconductor layer is formed on the substrate and has a first conductivity type. The light-emitting layer is formed on the first semiconductor layer. The second semiconductor layer is formed on the light-emitting layer and has a second conductivity type opposite to the first conductivity type. The first electrode is formed on the first semiconductor layer. The second electrode is formed on the second semiconductor layer. The insulating layer covers the plurality of light-emitting elements on the substrate so as to form a first opening and a second opening. The first opening exposes the first electrode of the light-emitting element in one end side of the row among the plurality of light-emitting elements. The second opening exposes the second electrode of the light-emitting element in another end side of the row among the plurality of light-emitting elements. The first electrode pad covers the first opening and is formed from the first opening over one region on the insulating layer. The first electrode pad is electrically connected to the first electrode. The second electrode pad covers the second opening and is formed from the second opening over another region spaced from the one region on the insulating layer. The second electrode pad is electrically connected to the second electrode.

DETAILED DESCRIPTION

Figure 1:
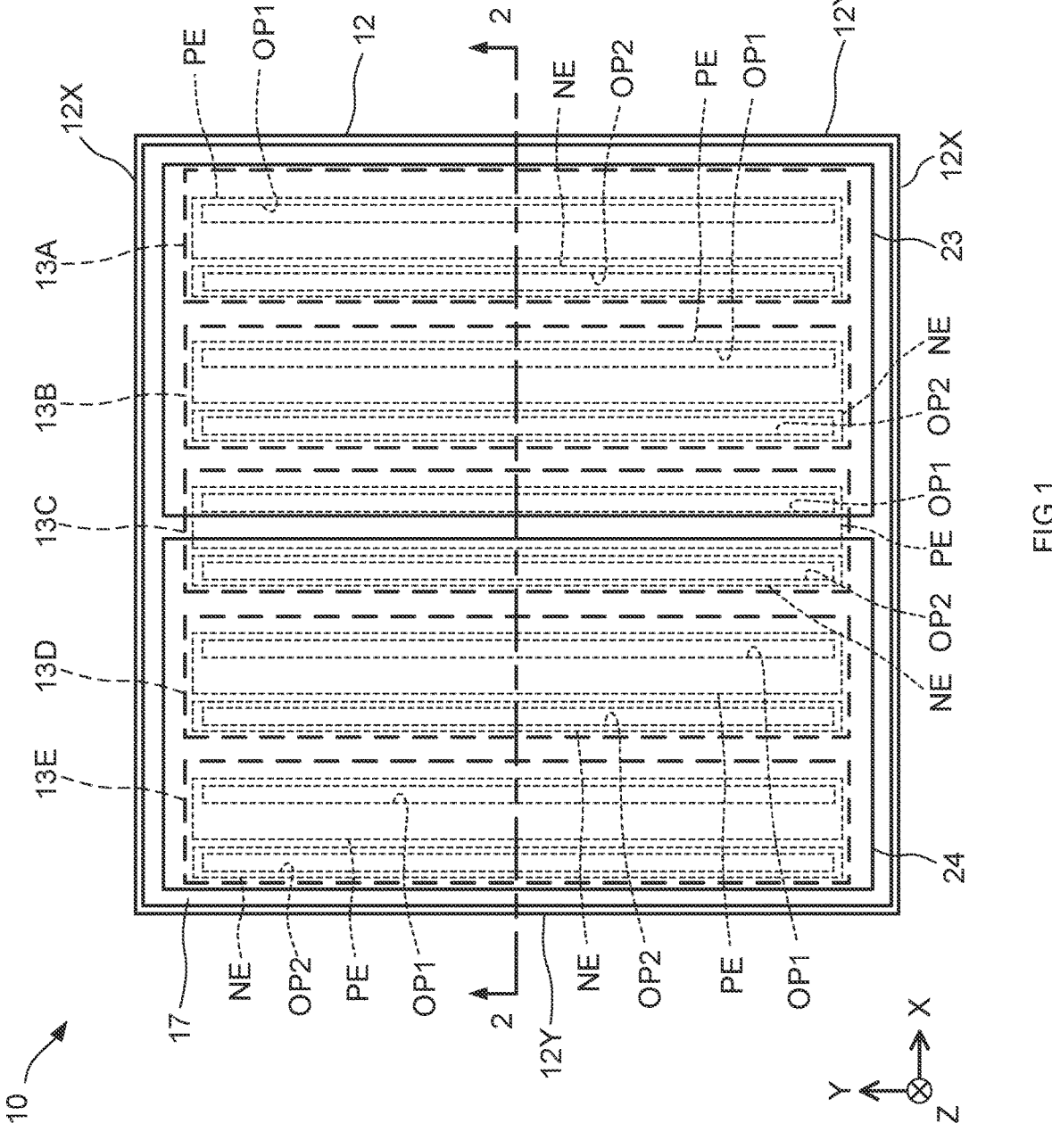
FIG. 1 is a top view of a light-emitting device according to Embodiment 1.

The following describes embodiments of the present invention in detail with reference to the drawings. In the drawings, the same reference numerals are attached to the same components, and the explanation of the overlapping components will be omitted.

Embodiment 1

Figure 2:
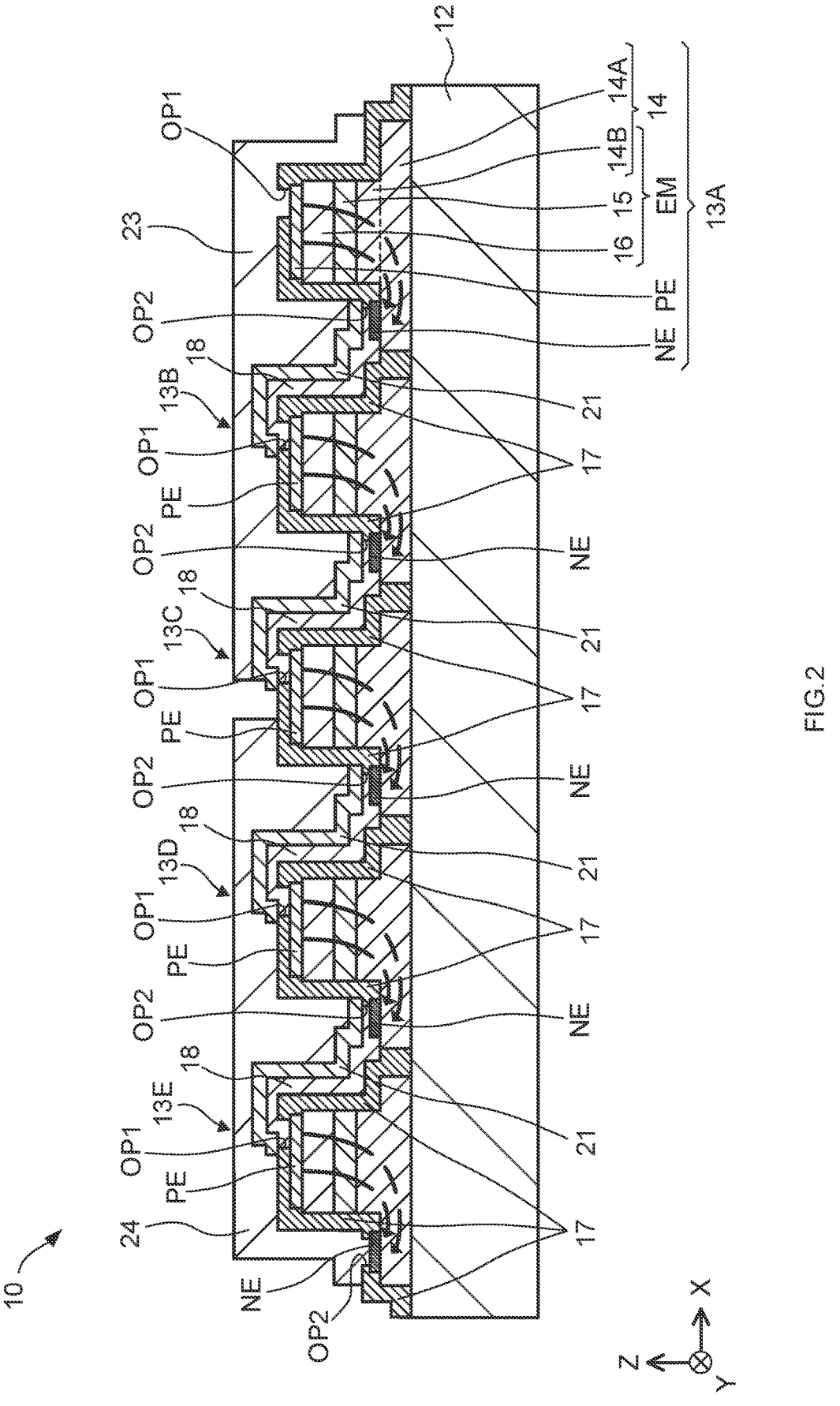
FIG. 2 is a cross-sectional view of the light-emitting device according to Embodiment 1.

With reference to FIG. 1 and FIG. 2, a configuration of a light-emitting device 10 according to Embodiment 1 will be described. FIG. 1 is a top view of the light-emitting device 10 according to Embodiment 1. FIG. 2 is a cross-sectional view taken along the line 2-2 of the light-emitting device 10 illustrated in FIG. 1. Hereinafter, for ease of explanation, X, Y, and Z-axes are defined as illustrated in FIG. 1 and FIG. 2. In the description of FIG. 1 and FIG. 2, the X-axis is a right-left direction of the light-emitting device 10, the Y-axis is a front-back direction of the light-emitting device 10, and the Z-axis is an up-down direction of the light-emitting device 10.

Outline of Light-Emitting Device

The light-emitting device 10 according to Embodiment 1 includes a substrate 12, five light-emitting elements 13A, 13B, 13C, 13D, and 13E, a first insulating layer 17 and a second insulating layer 21, transition wirings 18, and a first electrode pad 23 and a second electrode pad 24. The five light-emitting elements 13A, 13B, 13C, 13D, and 13E are disposed in a row on an upper surface of the substrate 12 (hereinafter, when the five light-emitting elements 13A to 13E are not distinguished, the light-emitting element is simply described as a light-emitting element 13). The first insulating layer 17 and the second insulating layer 21 cover each of the light-emitting elements 13A to 13E. The transition wirings 18 electrically connect between mutually adjacent light-emitting elements 13A to 13E. The first electrode pad 23 and the second electrode pad 24 are each electrically connected to a part of the light-emitting elements while each covering the first insulating layer 17 and the second insulating layer 21.

Substrate

The substrate 12 is a flat plate-shaped body with an insulating property and a translucent property, and has an upper surface in a rectangular shape. The substrate 12 is provided with the light-emitting elements 13A to 13E on the upper surface (one flat plate surface). The substrate 12 is also a growth substrate of a semiconductor crystal constituting the light-emitting elements 13A to 13E. The substrate 12 has a lower surface (the other flat plate surface) as a light-exiting surface of the light-emitting device 10.

For the substrate 12, single crystal sapphire (Al$_2$O$_3$), aluminum nitride (AlN), gallium nitride (GaN), or the like can be used. In this embodiment, single crystal sapphire is used for the substrate 12.

In the description below, a side in the right-left direction of the substrate 12 is referred to as a side 12X, and a side in the front-back direction is referred to as a side 12Y.

Light-Emitting Element

The light-emitting elements 13A to 13E have mutually equivalent rectangular shapes, and each have short sides disposed along a pair of the mutually opposed sides 12X of the rectangular substrate 12 and long sides disposed along the other pair of the mutually opposed sides 12Y of the substrate 12. The light-emitting elements 13A to 13E are disposed to be mutually spaced in a row in a direction along the side 12X in this order. In other words, the light-emitting elements 13A to 13E each have a strip shape having the long side along the side 12Y of the substrate 12 in top view, and are arranged in parallel in the side 12X-direction.

Each of the light-emitting elements 13 is configured of a nitride semiconductor such as GaN, and is a light emission diode (LED) that includes a semiconductor structure layer EM, a p-side electrode PE, and an n-side electrode NE. The semiconductor structure layer EM includes an n-type semiconductor layer 14, a light-emitting layer 15, and a p-type semiconductor layer 16. In other words, each of the light-emitting elements 13 is a light emission diode that includes the rectangular semiconductor structure layer EM along the outer shape of the light-emitting element 13 in the inner region of the light-emitting element 13.

The n-type semiconductor layer 14 is a semiconductor layer (first conductive layer) having a flat plate-shaped lower portion 14A disposed on the upper surface of the substrate 12 and an upper portion 14B projecting from the vicinity of the center in the direction along the short side of the lower portion 14A. Conductive carriers of the n-type semiconductor layer 14 are electrons (first conductivity type). The region in which the upper portion 14B is provided in the n-type semiconductor layer 14 is also a lower layer portion of the semiconductor structure layer EM. In other words, the n-type semiconductor layer 14 has a mesa-shaped structure (hereinafter also referred to as a mesa structure).

The light-emitting layer 15 is a semiconductor layer formed over the upper surface of the upper portion 14B of the n-type semiconductor layer 14, and emits a light by recombination of electrons and holes. The light-emitting layer 15 emits, for example, a blue light having a peak wavelength of 450 nm.

The p-type semiconductor layer 16 is a semiconductor layer (second conductive layer) formed over the upper surface of the light-emitting layer 15, and conductive carriers of the p-type semiconductor layer 16 are holes (second conductivity type).

The n-type semiconductor layer 14, the light-emitting layer 15, and the p-type semiconductor layer 16 may include a semiconductor layer to which impurities are added, a semiconductor layer to which impurities are not added, a strain relief layer that reduces a strain between layers, a composition gradient layer that gradually changes a crystal composition, a quantum well layer with quantum effect, a barrier layer that suppress carrier diffusion, a contact layer that reduces a contact resistance with the n-side electrode or the p-side electrode, and the like as necessary according to the purpose.

A distance (width) between the opposed two long sides of the semiconductor structure layer EM is from 20 times to 100 times of a thickness of the n-type semiconductor layer 14 from the upper surface of the substrate 12 to the lower surface of the light-emitting layer 15. This range enables suppressing unbalanced current flowing to the semiconductor structure layers EM. Since the thickness of the n-type semiconductor layer 14 in this embodiment is 3 μm, the width of the semiconductor structure layer EM is set to 150 μm.

The semiconductor structure layer EM does not need to be disposed in the vicinity of the center of the lower portion 14A of the n-type semiconductor layer 14. For example, it is only necessary that the upper surface of the lower portion 14A of the n-type semiconductor layer 14 has a surface on which the n-side electrode NE is disposed, and the semiconductor structure layer EM can be disposed to be shifted to the side in which the n-side electrode is not disposed.

The n-side electrode NE is formed on the upper surface of the lower portion 14A of the n-type semiconductor layer 14, and is a rectangular electrode having an upper surface shape along the long side and the short side of the semiconductor structure layer EM. The n-side electrodes NE are disposed in the same side surface side in the arrangement of the light-emitting elements 13A to 13E.

The n-side electrode NE is formed at a position spaced from the side surface of the upper portion 14B by a predetermined distance on the upper surface of the lower portion 14A.

The n-side electrode NE is formed by laminating titanium (Ti), aluminum (Al), Ti, and aurum (Au) in this order on the upper surface of the lower portion 14A of the n-type semiconductor layer 14.

The n-side electrode NE functions as an ohmic electrode that forms a satisfactory ohmic contact with the n-type semiconductor layer 14.

The p-side electrode PE is formed on the upper surface of the p-type semiconductor layer 16, and is a rectangular electrode having an upper surface shape along the long side and the short side of the semiconductor structure layer EM.

The p-side electrode PE is formed to be spaced from an edge of the semiconductor structure layer EM by a predetermined distance on the upper surface of the p-type semiconductor layer 16.

The p-side electrode PE is formed by laminating an indium tin oxide (ITO) electrode with translucency and metal layers of Nickel (Ni), argentum (Ag), Ti, and Au in this order on the upper surface of the p-type semiconductor layer 16.

The ITO electrode of the p-side electrode PE functions as an ohmic electrode that forms a satisfactory ohmic contact with the p-type semiconductor layer 16.

The metal layers of Ni and Ag function as reflection layers that reflect the above-described blue light emitted from the light-emitting layer 15. That is, the metal layers reflect the blue light emitted from the light-emitting layer 15 and traveling toward the p-side electrode PE to the substrate 12 side. Accordingly, from the lower surface of the substrate 12 (light-exiting surface of the light-emitting device 10), the blue light emitted from the light-emitting layer 15 and reflected by the reflection layers and the blue light traveling directly to the substrate 12 are output.

The long sides of the n-side electrode NE and the p-side electrode PE are formed to be approximately parallel to the long side of the semiconductor structure layer EM. The lengths of the long sides of the n-side electrode NE and the p-side electrode PE are approximately equal lengths. This configuration allows approximately uniformly flowing the current in the long side direction (Y-direction) and the short side direction (X-direction) of the semiconductor structure layer EM.

First Insulating Layer

The first insulating layers 17 are coating layers that cover the entire surfaces of the respective light-emitting elements 13A to 13E on the upper surface of the substrate 12. The first insulating layer 17 has an insulating property, and contains silicon dioxide ($SiO_2$). The first insulating layer 17 is provided with an opening OP1 from which a part of the p-side electrode PE formed on the upper surface of the p-type semiconductor layer 16 is exposed. The opening OP1 is formed over the p-side electrode PE in the longitudinal direction, and has an upper surface in an elongated rectangular shape.

The first insulating layer 17 is provided with an opening OP2 from which a part of the n-side electrode NE formed on the upper surface of the lower portion 14A of the n-type semiconductor layer 14 is exposed. The opening OP2 is formed over the n-side electrode NE in the longitudinal direction, and has an upper surface in an elongated rectangular shape.

Transition Wiring

The transition wiring 18 is a metal wiring that connects between the n-side electrode NE and the p-side electrode PE of the mutually adjacent light-emitting elements. Specifically, the transition wiring 18 is formed from the opening OP2 of one light-emitting element to the opening OP1 of the other light-emitting element of the adjacent light-emitting elements on the upper surface of the first insulating layer 17 between the opening OP1 and the opening OP2. That is, the transition wiring 18 has an upper surface shape in a strip shape. In FIG. 1, for avoiding complicating the drawing, the transition wiring 18 is omitted.

As illustrated in FIG. 2, the transition wiring 18 electrically connects between the n-side electrode NE of the light-emitting element 13A and the p-side electrode PE of the light-emitting element 13B, electrically connects between the n-side electrode NE of the light-emitting element 13B and the p-side electrode PE of the light-emitting element 13C, electrically connects between the n-side electrode NE of the light-emitting element 13C and the p-side electrode PE of the light-emitting element 13D, and electrically connects between the n-side electrode NE of the light-emitting element 13D and the A-side electrode PE of the light-emitting element 13E.

That is, the transition wirings 18 electrically connect between the respective light-emitting elements 13A to 13E in series. In other words, the light-emitting elements 13A to 13E are mutually connected in series via the respective transition wirings 18 in the arrangement order. Accordingly, the p-side electrode PE exposed from the opening OP1 on the light-emitting element 13A serves as an electrode of one end of the series connection, and the n-side electrode NE exposed from the opening OP2 on the light-emitting element 13E serves as an electrode of the other end of the series connection.

The transition wiring 18 is formed by laminating Ni and Al in this order on the first insulating layer 17, the p-side electrode PE, and the n-side electrode NE. For the transition wiring 18, a metal that reflects a light emitted from the light-emitting layer 15 is preferable. For the transition wiring 18, for example, Ag, platinum (Pt), palladium (Pd), rhodium (Rh), or the like can be used instead of Al. The strip shape of the transition wiring 18 allows uniformly flowing the current between the light-emitting elements 13A to 13E.

Second Insulating Layer

The second insulating layers 21 are coating layers that cover the respective transition wirings 18. The second insulating layer has an insulating property, and contains $SiO_2$.

As described above, the first insulating layers 17 cover the respective light-emitting elements 13A to 13E, and the second insulating layers 21 cover the respective transition wirings 18 that connect between the light-emitting elements 13A to 13E. Accordingly, the light-emitting elements 13A to 13E are exposed from the first insulating layer 17 and the second insulating layer 21 and can be electrically conductive with the outside only via the opening OP1 on the light-emitting element 13A and the opening OP2 on the light-emitting element 13E on the substrate 12.

First Electrode Pad

The first electrode pad 23 is an electrode pad formed so as to cover the p-side electrode PE exposed from the opening OP1 on the light-emitting element 13A. The first electrode pad 23 covers the opening OP1 on the light-emitting element 13A, and is formed from the upper surface of the first insulating layer 17 covering the light-emitting element 13A to the upper surface of the second insulating layer 21 covering the light-emitting element 13C over the light-emitting element 13B.

That is, the first electrode pad 23 is electrically connected to the light-emitting element 13A via the p-side electrode PE exposed from the opening OP1 on the light-emitting element 13A. Accordingly, the first electrode pad 23 functions as an anode electrode that receives a supply of an electric power from outside and applies a voltage to the p-type semiconductor layer 16 of the light-emitting element 13A via the p-side electrode PE.

In this embodiment, the first electrode pad 23 is an electrode pad having a rectangular upper surface shape in which the direction along the side 12X of the substrate 12 is a short side direction and the direction along the side 12Y of the substrate 12 is a longer side direction.

In this embodiment, the first electrode pad 23 is formed by laminating Ni, Al, Ti, and Au in this order on the p-side electrode PE, the first insulating layer 17, and the second insulating layer 21.

Second Electrode Pad

The second electrode pad 24 is an electrode pad formed to be spaced from the first electrode pad 23 so as to cover the n-side electrode NE exposed from the opening OP2 on the light-emitting element 13E. The second electrode pad 24 covers the opening OP2 on the light-emitting element 13E, and is formed from the upper surface of the first insulating layer 17 covering the light-emitting element 13E to the upper surface of the first insulating layer 17 covering the light-emitting element 13C over the light-emitting element 13D.

That is, the second electrode pad 24 is electrically connected to the light-emitting element 13E via the n-side electrode NE exposed from the opening OP2 on the light-emitting element 13E. Accordingly, the second electrode pad 24 functions as a cathode electrode that receives a supply of an electric power from outside and applies a voltage to the n-type semiconductor layer 14 of the light-emitting element 13E via the n-side electrode NE.

In this embodiment, the second electrode pad 24 is an electrode pad having a rectangular upper surface shape in which the direction along the side 12X of the substrate 12 is a short side direction and the direction along the side 12Y of the substrate 12 is a longer side direction.

In this embodiment, similarly to the first electrode pad 23, the second electrode pad 24 is formed by laminating Ni, Al, Ti, and Au in this order on the n-side electrode NE, the first insulating layer 17, and the second insulating layer 21.

The Al layers constituting the first electrode pad 23 and the second electrode pad 24 function as reflection layers that reflect the blue light emitted from each of the light-emitting elements 13A to 13E and attempting to exude outside the first insulating layer 17. The Ti layer functions as also a barrier layer that avoids diffusion of a part of the Au layer on the Ti layer to the Al layer.

As described above, in the light-emitting device 10, the first electrode pad 23 as the anode electrode is connected to the light-emitting element 13A that serves as the one end of the series connection via the p-side electrode PE exposed from the opening OP1, and the second electrode pad 24 as the cathode electrode is connected to the light-emitting element 13E that serves as the other end of the series connection via the n-side electrode NE exposed from the opening OP2.

Therefore, in this embodiment, the voltage is applied to the light-emitting element 13A and the light-emitting element 13E via the first electrode pad 23 and the second electrode pad 24, accordingly, the current flows in the respective semiconductor structure layers EM of the light-emitting elements 13A to 13E connected in series (arrow directions in FIG. 2), and then the blue light is emitted from the light-emitting layers 15.

According to the light-emitting device 10 of this embodiment, in each of the light-emitting elements 13A to 13E, the n-side electrode NE and the p-side electrode PE are disposed in parallel to the long side of the semiconductor structure layer EM. The lengths of the n-side electrode NE and the p-side electrode PE are configured to be equal. Therefore, as indicated by arrows in FIG. 2, the current equally flows in the short side direction of the semiconductor structure layer EM with the widths (lengths) of the n-side electrode NE and the p-side electrode PE. In other words, since the current does not flow locally inside the semiconductor structure layer EM, the local deterioration can be avoided, and the uniform emission of the light is enabled.

Since the five light-emitting elements 13A to 13E are connected in series, the light-emitting device 10 can be lit with a drive circuit of a high voltage system (for example, 18 V system).

In the light-emitting device 10, the first electrode pad 23 and the second electrode pad 24 including the reflection layers are disposed so as to cover each of the light-emitting elements 13A to 13E, and the separate portion between the first electrode pad 23 and the second electrode pad 24 is disposed on the p-side electrode PE of the light-emitting element 13C. Accordingly, since the blue light emitted from the light-emitting elements 13A to 13E to the first electrode pad 23 and the second electrode pad 24 side can be reflected to the substrate 12 side (light-exiting surface side of the light-emitting device 10), the light output of the light-emitting device 10 can be increased.

Method for Producing Light-Emitting Device

Here, with reference to FIG. 3 to FIG. 10, a method for producing the light-emitting device 10 of this embodiment will be described. FIG. 3 to FIG. 10 are cross-sectional views of the light-emitting device 10 each illustrating a part of the manufacturing process of the light-emitting device 10.

Figure 3:
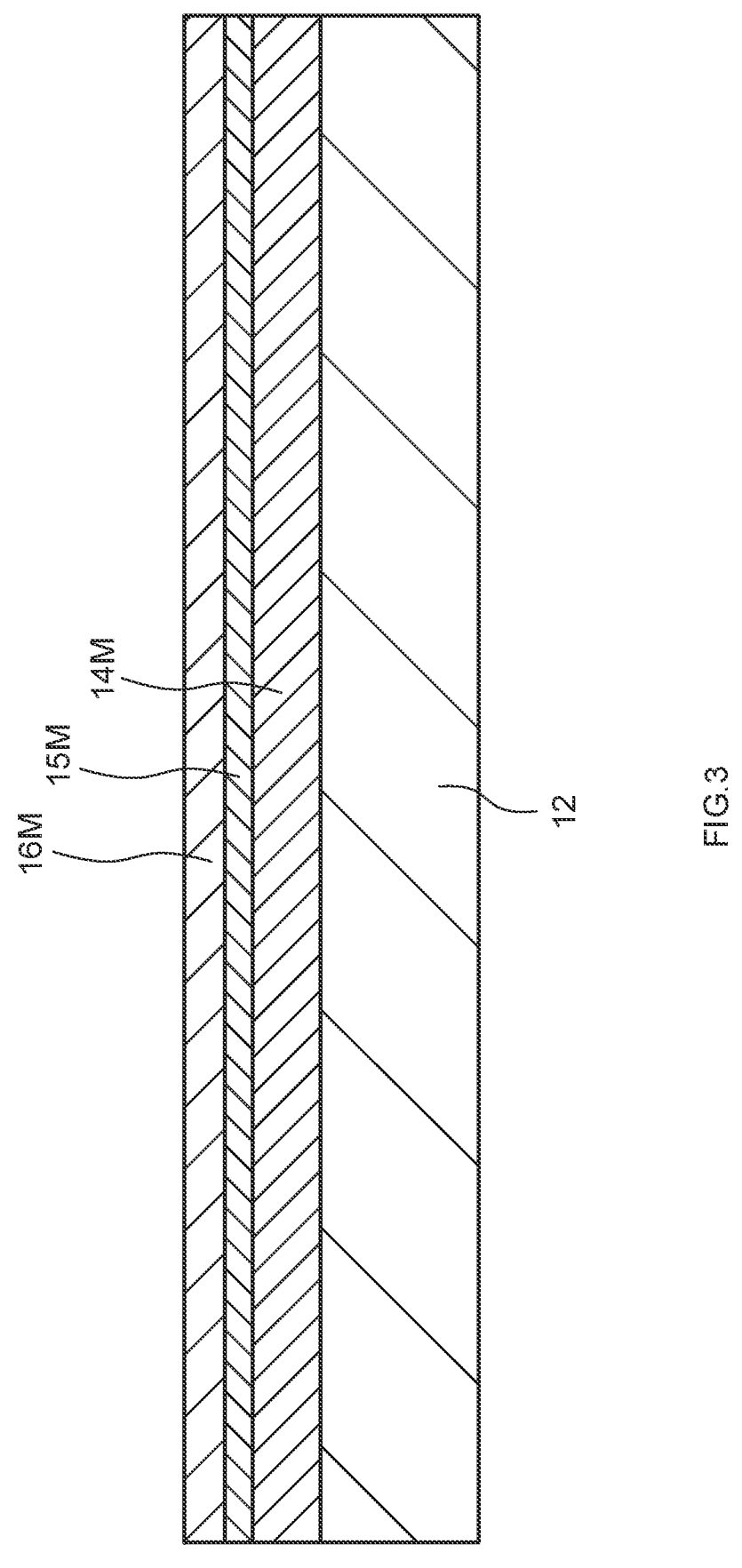
FIG. 3 is a cross-sectional view illustrating a part of a manufacturing process of the light-emitting device according to Embodiment 1.

First, as illustrated in FIG. 3, an n-type semiconductor layer 14M, a light-emitting layer 15M, and a p-type semiconductor layer 16M to be the n-type semiconductor layer 14, the light-emitting layer 15, and the p-type semiconductor layer 16 are laminated in this order on the substrate 12 as a growth substrate, thus preparing a substrate on which the semiconductor layers have been formed.

Figure 4:
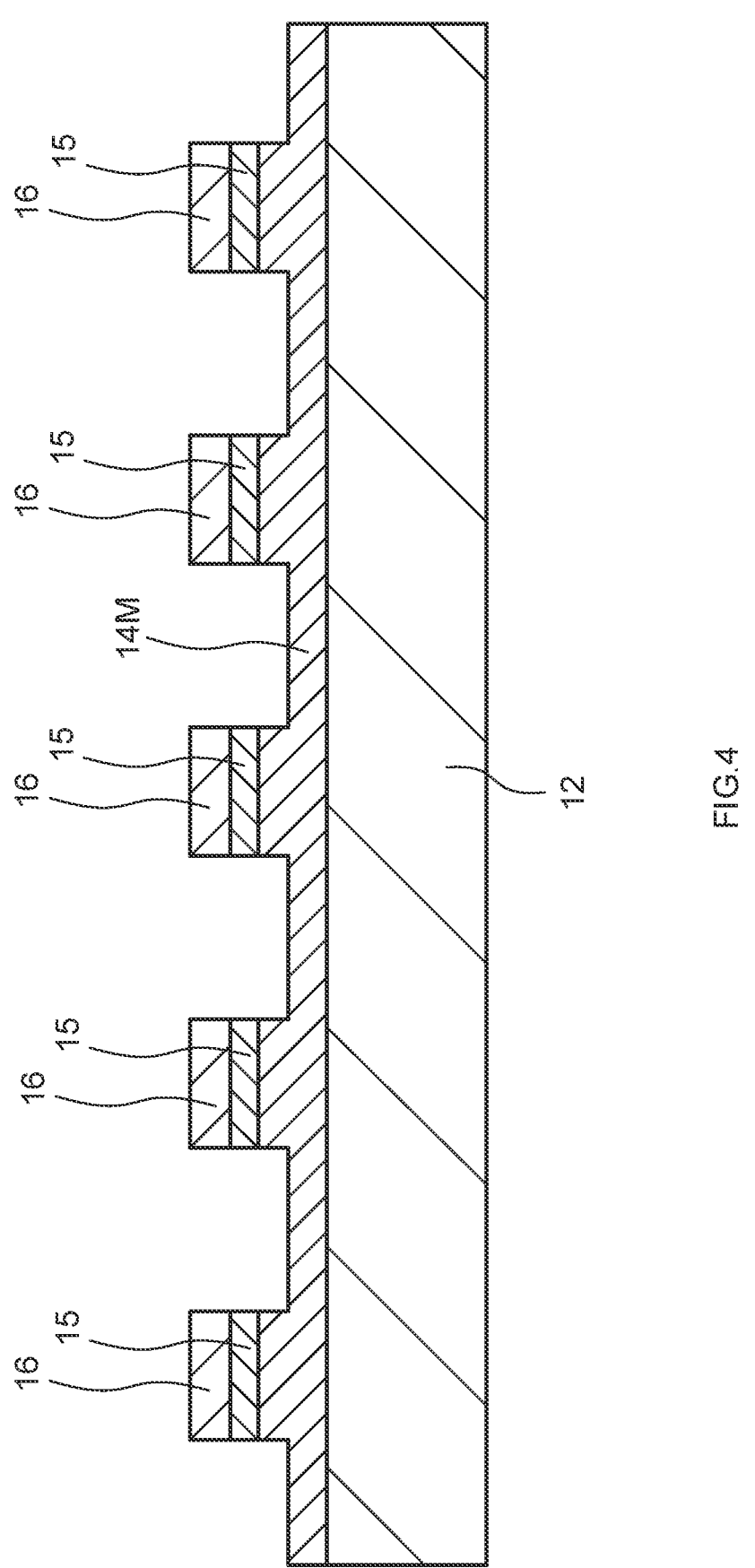
FIG. 4 is a cross-sectional view illustrating a part of the manufacturing process of the light-emitting device according to Embodiment 1.

First, as illustrated in FIG. 4, divided semiconductor structure layers EM are formed (Step S1: light-emitting region dividing step). Specifically, a resist mask is formed so as to cover the regions in which the semiconductor structure layers EM are to be formed and expose the other region.

Then, by a reactive ion etching (RIE) method, an etching process is performed on the already formed semiconductor laminated layers exposed from the opening portions of the resist mask (portions on which the resist mask is not formed) until the n-type semiconductor layer 14M is exposed. Subsequently, by removing the resist mask, the divided semiconductor structure layers EM can be formed as illustrated in FIG. 4.

Figure 5:
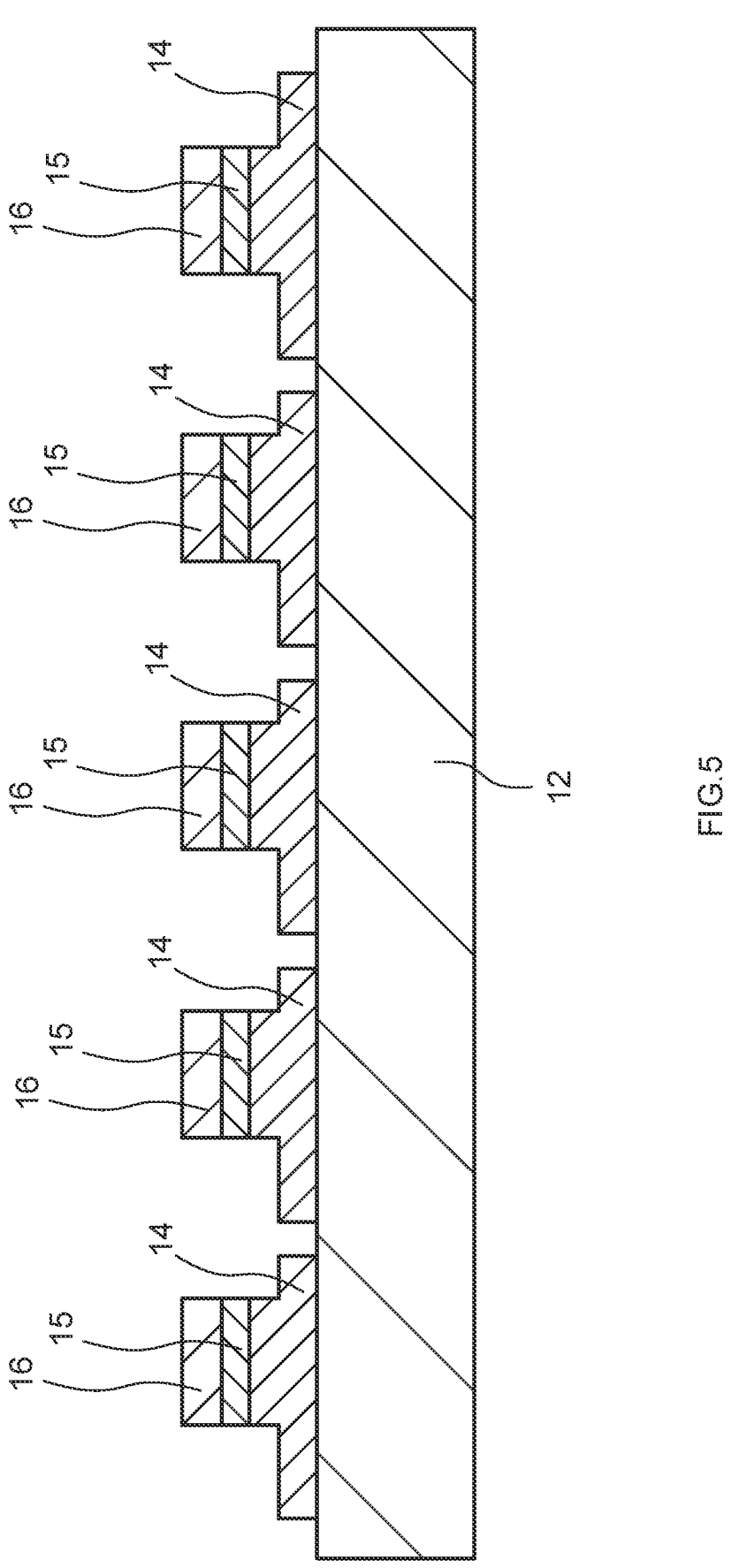
FIG. 5 is a cross-sectional view illustrating a part of the manufacturing process of the light-emitting device according to Embodiment 1.

Next, as illustrated in FIG. 5, the n-type semiconductor layer 14M on the substrate 12 is divided to form element regions of the respective light-emitting elements 13A to 13E (Step S2: element region dividing step). Specifically, a resist mask is formed so as to cover the regions in which the light-emitting elements 13A to 13E are to be formed and expose the other region.

Then, by the RIE method, an etching process is performed on the n-type semiconductor layer 14M exposed from the opening portions of the resist mask until the substrate 12 is exposed. Subsequently, by removing the resist mask, the regions in which the light-emitting elements 13A to 13E are to be formed can be formed on the upper surface of the substrate 12 as illustrated in FIG. 5.

Figure 6:
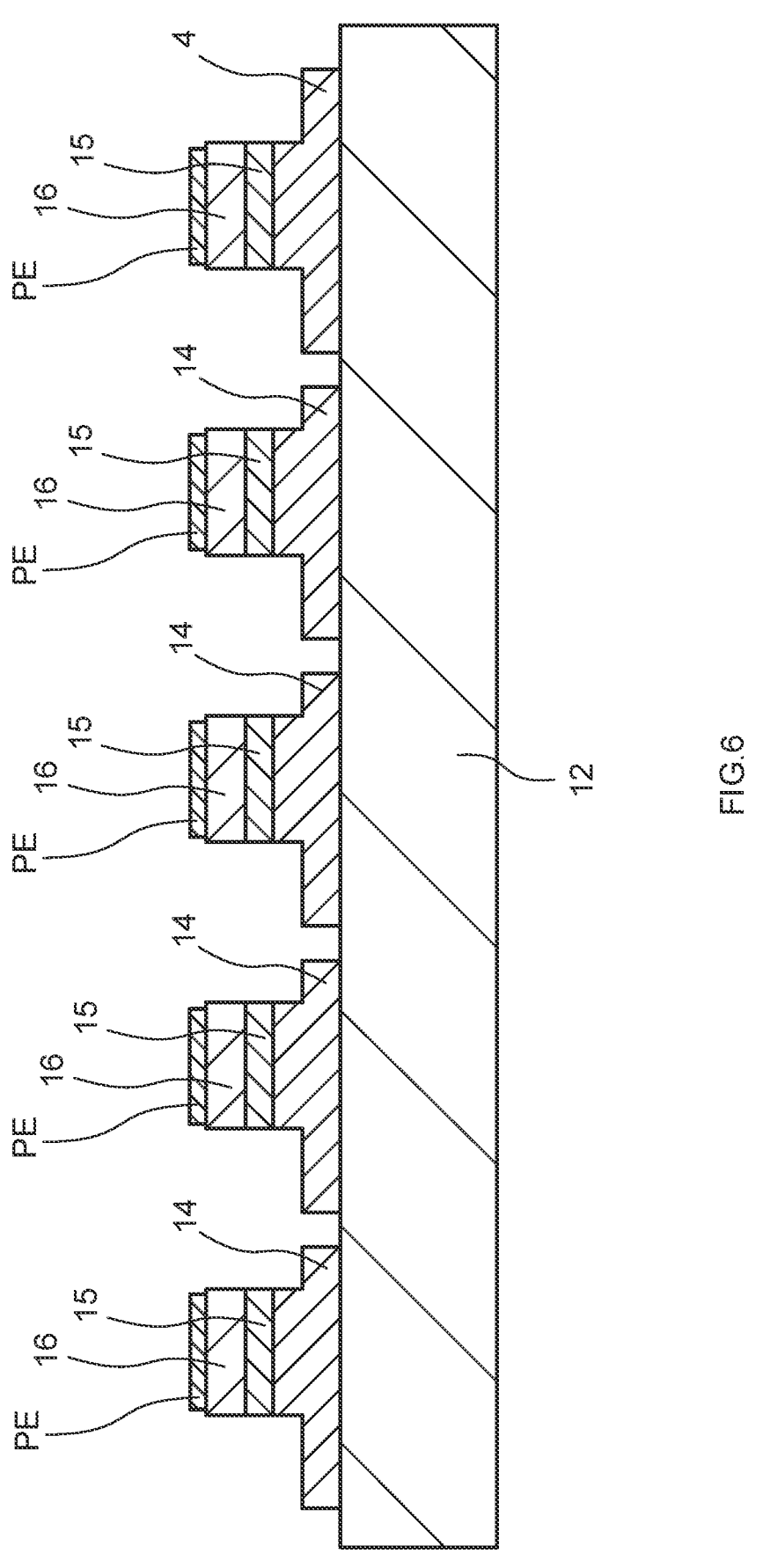
FIG. 6 is a cross-sectional view illustrating a part of the manufacturing process of the light-emitting device according to Embodiment 1.

Next, as illustrated in FIG. 6, the p-side electrodes PE are formed on the p-type semiconductor layers 16 of the respective light-emitting elements 13 (Step S3: p-side electrode forming step). Specifically, a resist mask with opening portions at upper surfaces of the p-type semiconductor layers 16 is formed, and an ITO film is formed by a sputtering method. Subsequently, layers of Ni and Ag are formed on the ITO film in this order by an EB (ion beam)

method. Subsequently, layers of Ti and Au are formed on the formed Ni and Ag layers in this order by the EB method.

Then, by removing the resist mask, as illustrated in FIG. 6, the p-side electrodes PE formed on the p-type semiconductor layers 16 can be obtained. As the metal layer used for the superficial layer of the p-side electrode PE, a layer of Pt, Pd, or Rh may be formed instead of Au.

Figure 7:
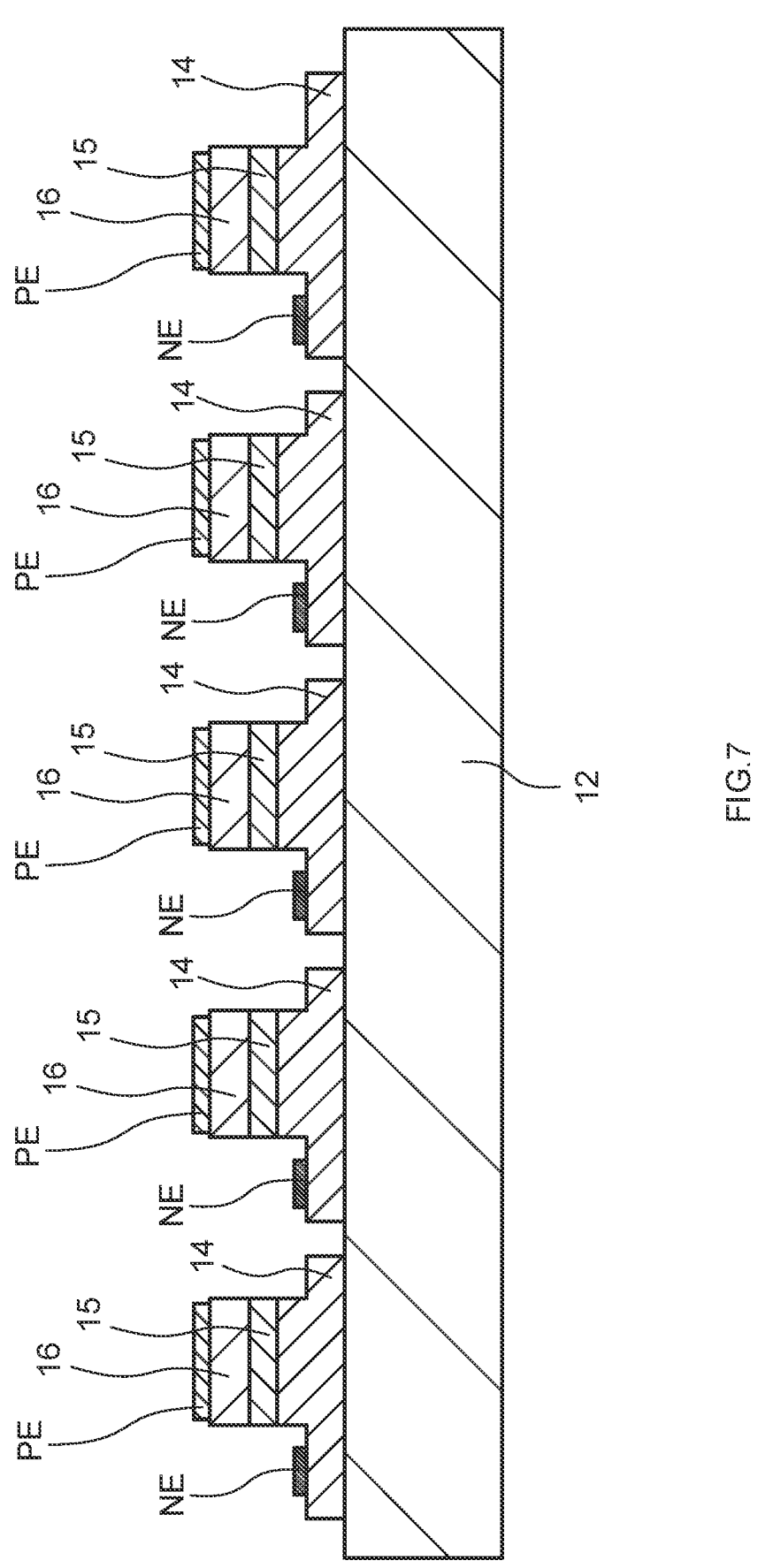
FIG. 7 is a cross-sectional view illustrating a part of the manufacturing process of the light-emitting device according to Embodiment 1.

Next, as illustrated in FIG. 7, the n-side electrodes NE are formed on the upper surfaces of the lower portions 14A of the respective n-type semiconductor layers 14 in the portions to be the light-emitting elements 13A to 13E (Step S4: n-side electrode forming step). Specifically, a resist mask with opening portions at the regions in which the n-side electrodes NE are to be formed on the upper surfaces of the lower portions 14A is formed, and layers of Ti, Al, Ti, and Au are formed in this order by the EB method.

Then, by removing the resist mask, as illustrated in FIG. 7, the n-side electrodes NE formed on the upper surfaces of the lower portions 14A of the n-type semiconductor layers 14 can be obtained. As the metal layer used for the superficial layer of the n-side electrode NE, a layer of Pt, Pd, or Rh may be formed instead of Au.

Figure 8:
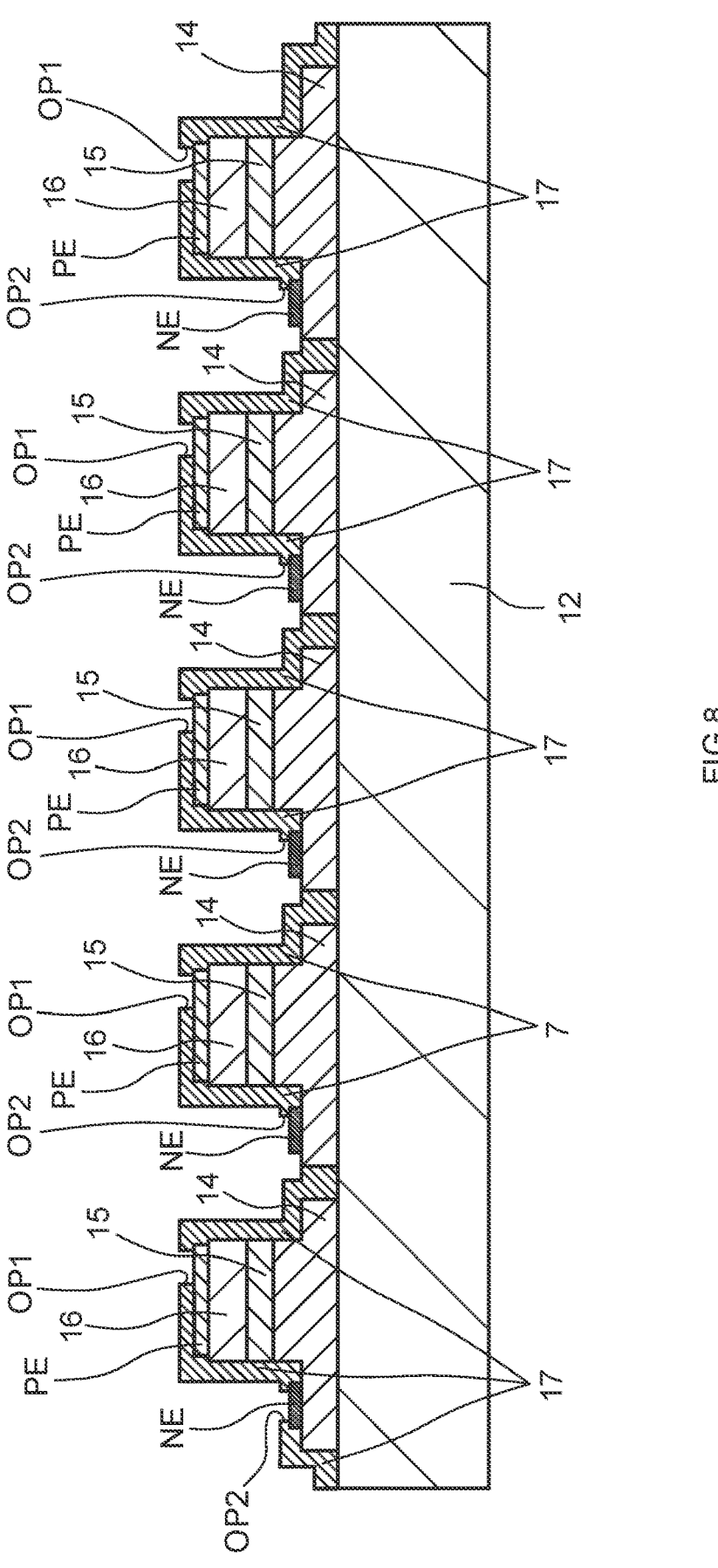
FIG. 8 is a cross-sectional view illustrating a part of the manufacturing process of the light-emitting device according to Embodiment 1.

Next, as illustrated in FIG. 8, the first insulating layers 17 covering the respective light-emitting elements 13A to 13E are formed so as to be each provided with the opening OP1 and the opening OP2 (Step S5: first insulating layer forming step). Specifically, a SiO$_2$ layer is formed over the whole surface of the processed surface of the substrate 12 to which the above-described processes up to the Step S4 have been performed by the sputtering method. Then, a resist mask with opening portions at regions corresponding to the respective openings OP1 and openings OP2 is formed on the formed SiO$_2$ layer.

Subsequently, an etching is performed to remove the SiO$_2$ layer at the opening portions of the resist mask with a buffered hydrofluoric acid. At this time, the metal layers of the uppermost surfaces of the p-side electrode PE and the n-side electrode NE, that is, the Au layers serve as etching stop layers. Accordingly, as illustrated in FIG. 8, the first insulating layer 17 with the opening OP1 and the opening OP2 can be formed on each of the light-emitting elements 13A to 13E.

Figure 9:
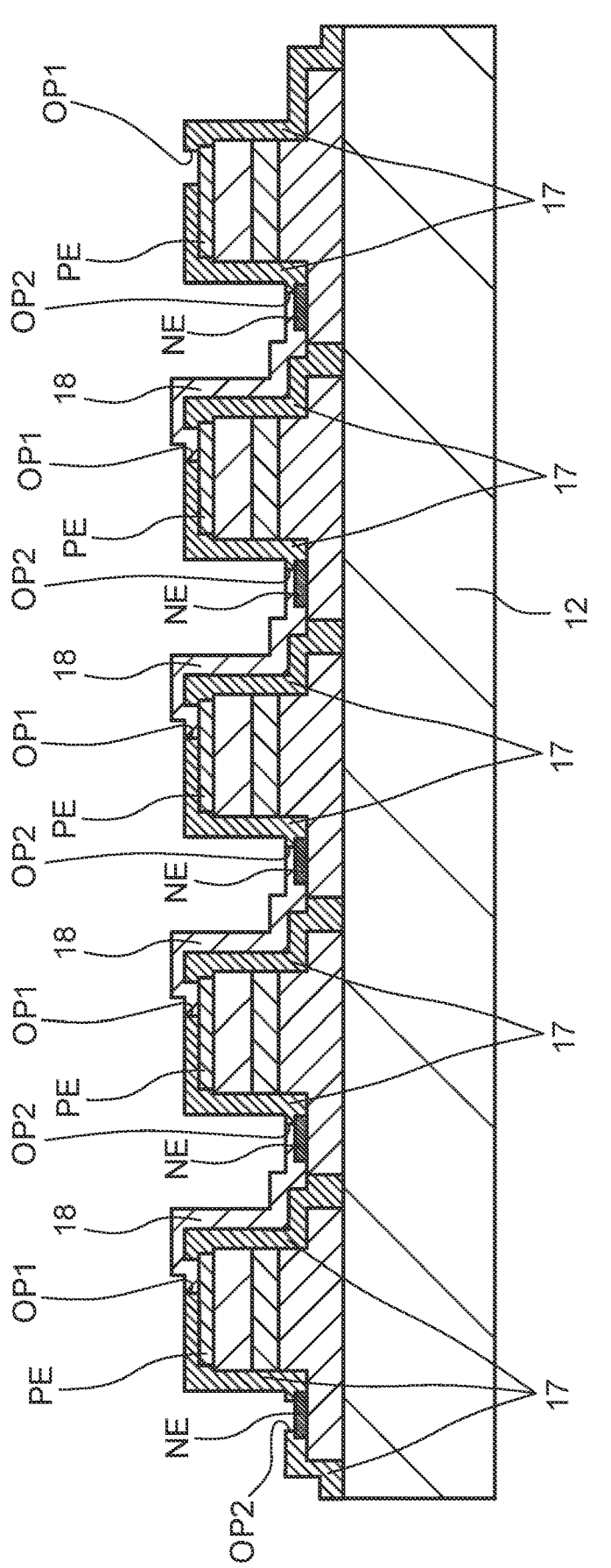
FIG. 9 is a cross-sectional view illustrating a part of the manufacturing process of the light-emitting device according to Embodiment 1.

Next, as illustrated in FIG. 9, the transition wirings 18 that each electrically connect between the p-side electrode PE exposed from the opening OP1 of one light-emitting element of adjacent two light-emitting elements and the n-side electrode NE exposed from the opening OP2 of the other light-emitting element are formed (Step S6: transition wiring forming step).

Specifically, a resist mask with opening portions at the p-side electrodes PE exposed from the openings OP1 of the respective light-emitting elements 13B to 13E and the n-side electrodes NE exposed from the openings OP2 of the respective light-emitting elements 13A to 13D is formed on the first insulating layers 17.

Subsequently, layers of Ni and Al are formed in this order at the opening portions by the EB method. Then, as illustrated in FIG. 9, by removing the resist mask, the transition wirings 18 formed so as to connect between the respective light-emitting elements 13A to 13E can be obtained.

Figure 10:
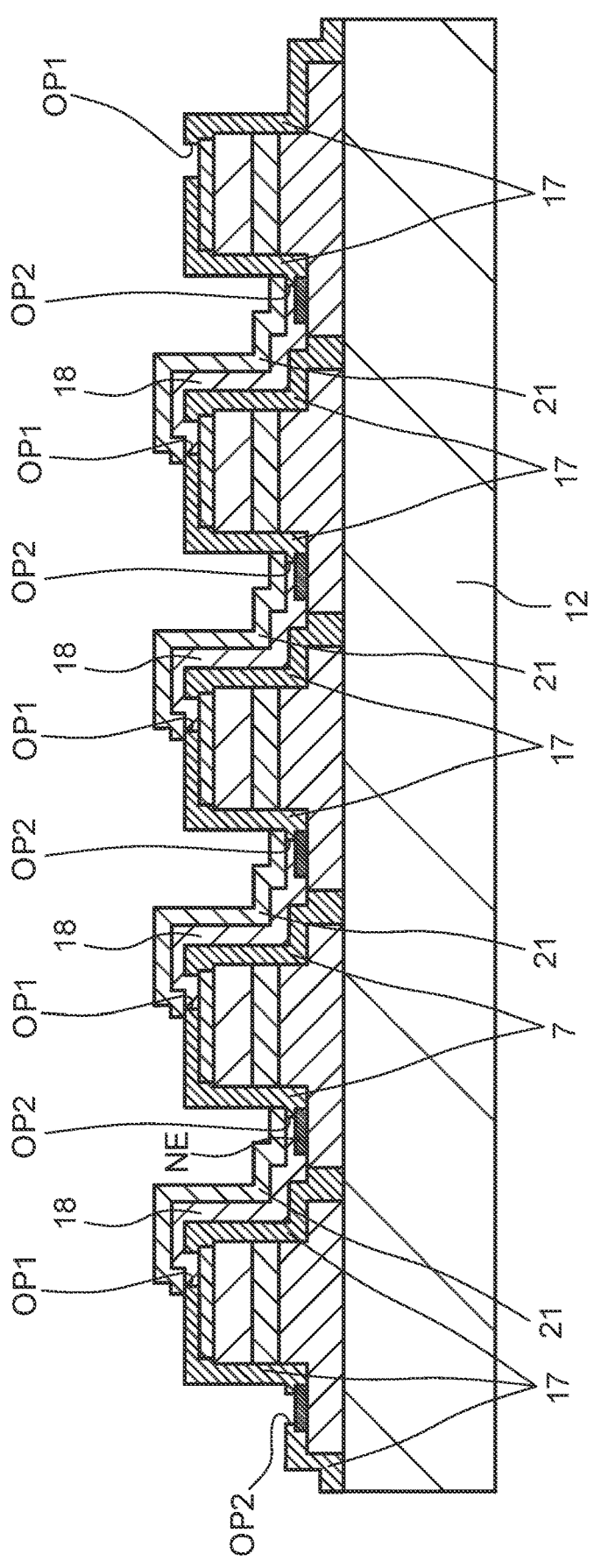
FIG. 10 is a cross-sectional view illustrating a part of the manufacturing process of the light-emitting device according to Embodiment 1.

Next, as illustrated in FIG. 10, the second insulating layers 21 are formed so as to cover the respective transition wirings 18 (Step S7: second insulating layer forming step). Specifically, a resist mask having openings at the p-side electrode PE exposed from the opening OP1 on the light-emitting element 13A and the n-side electrode NE exposed from the opening OP2 on the light-emitting element 13E is formed. The openings of the resist mask are slightly larger than the shapes of the exposed electrodes.

Subsequently, a SiO$_2$ layer is formed over the whole surface of the processed surface of the substrate 12 to which the above-described process has been performed by the sputtering method. Then, the resist mask is peeled off by lift-off, and thus, as illustrated in FIG. 10, the light-emitting element 13A with the p-side electrode PE exposed from the opening OP1 and the light-emitting element 13E with the n-side electrode NE exposed from the opening OP2 can be obtained.

At last, the first electrode pad 23 and the second electrode pad 24 are formed on the light-emitting device produced by Step S7 (Step S8: electrode pad forming step). Specifically, a resist mask with opening portions at a surface on which the first electrode pad 23 is to be formed and a surface on which the second electrode pad 24 is to be formed is formed on the substrate 12.

Then, layers of Ni, Al, Ti, and Au are formed in this order at the opening portions by the EB method, and the resist mask is removed by lift-off. Thus, as illustrated in FIG. 1 and FIG. 2, the light-emitting device 10 in which the first electrode pad 23 and the second electrode pad 24 have been formed can be obtained. That is, by the above-described processes of Steps S1 to S8, the light-emitting device 10 described in this embodiment can be obtained.

Example of Using Light-Emitting Device

Figure 11:
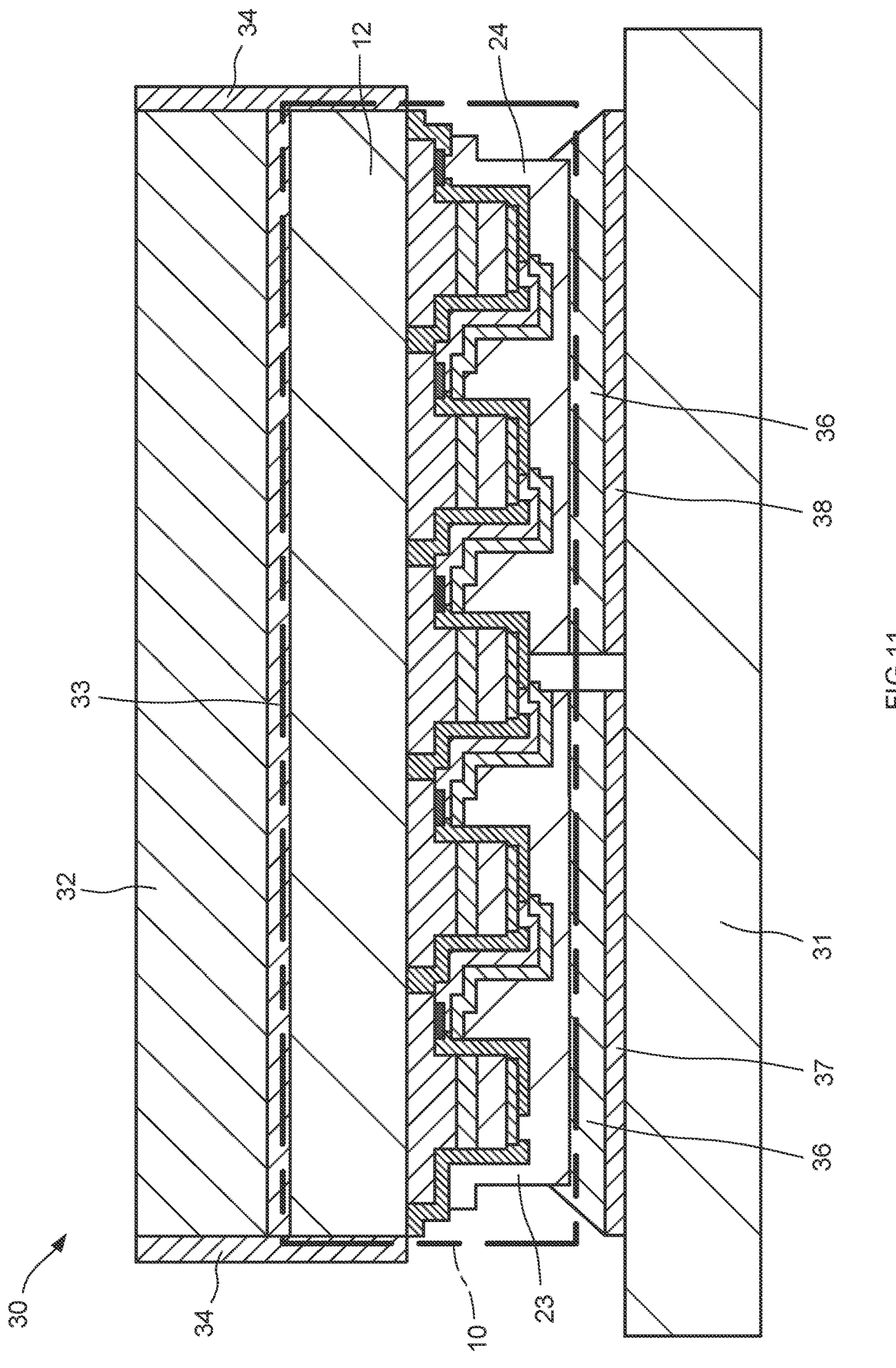
FIG. 11 is a cross-sectional view of the light-emitting device illustrating an example of using the light-emitting device according to Embodiment 1.

Here, with reference to FIG. 11, a specific example of using the light-emitting device 10 in this embodiment will be described. FIG. 11 illustrates an example of using the light-emitting device 10, and is a cross-sectional view of a light-emitting module device 30 mounted to a part of a circuit board 31 on which a capacitor, a resistor, an IC chip, and the like are mounted. In this example of use, the light-emitting module device 30 includes the light-emitting device 10 with a wavelength conversion member 32 and a light shielding layer 34, and the light-emitting module device 30 is mounted to the circuit board 31.

In the light-emitting module device 30, the wavelength conversion member 32 is bonded to the upper surface of the light-exiting surface of the light-emitting device 10 via a translucent adhesive layer 33 such as a silicone resin. The wavelength conversion member 32 has the same shape as the light-exiting surface. The light-emitting module device 30 includes the light shielding layer 34 that covers the side surfaces of the light-emitting device 10, the adhesive layer 33, and the wavelength conversion member 32.

The wavelength conversion member 32 contains phosphor particles that are excited by the blue light emitted from the light-emitting device 10 and emit a yellow fluorescence. The wavelength conversion member 32 contains Al$_2$O$_3$ as a base material and phosphor particles of yttrium aluminum garnet having cerium (Ce) as a luminescence center (YAG: Ce) contained in the base material.

The light shielding layer 34 reflects the blue light emitted from the light-emitting device 10 and the yellow fluorescence generated by the wavelength conversion member 32. That is, the light shielding layer 34 suppresses the light leakage from the side surface of the light-emitting module device 30, and improves the output of the light output from the upper surface of the wavelength conversion member 32.

The light shielding layer 34 is made of a reflective resin material in which a silicone resin contains titanium oxide (TiO$_2$) particles. It is only necessary that the light shielding layer 34 is made of a material with light reflectivity, and for example, the light shielding layer 34 may be made of thermal-sprayed alumina, or may be made of a dielectric multilayer film that reflects a blue light and a yellow fluorescence.

Since the light-emitting module device 30 is based on the light-emitting device (which is a part enclosed by a dash-dotted line in the drawing), the first electrode pad 23 and the second electrode pad 24 of the light-emitting device 10 serve as the first electrode pad and the second electrode pad of the light-emitting module device 30.

According to this embodiment, the first electrode pad 23 and the second electrode pad 24 can be placed on an anode wiring 37 and a cathode wiring 38 of the circuit board 31, over which a solder paste that serves as a joining member 36 is applied, simultaneously with other components (which include chip resistor, chip capacitor, and the like), and collectively mounted by reflow.

Additionally, since the first electrode pad 23 and the second electrode pad 24 have the equivalent size, and is disposed in symmetry, a phenomenon (Manhattan phenom-enon) that the light-emitting module device 30 stands upside-down in the reflow can be suppressed.

Embodiment 2

Figure 12:
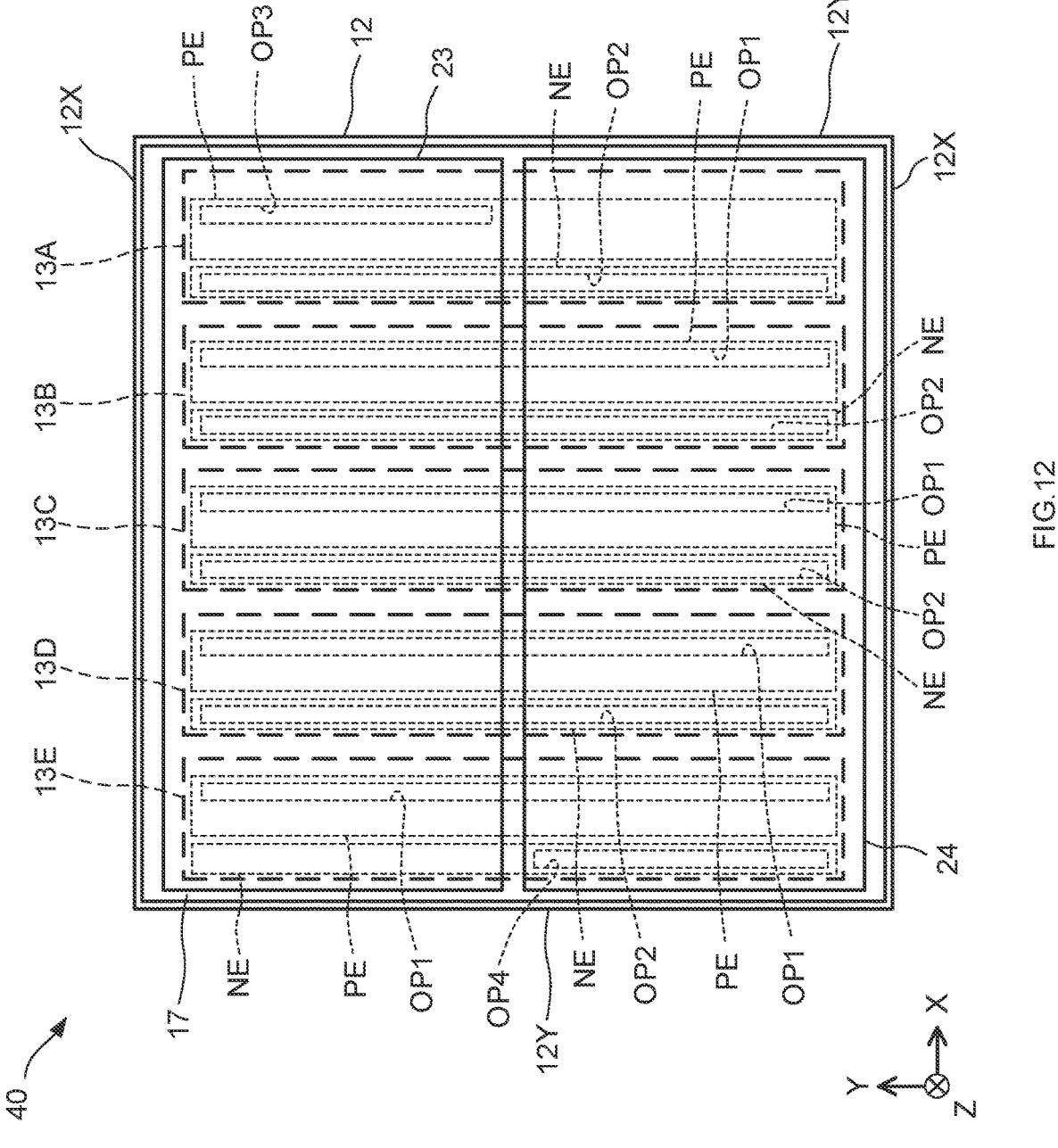
FIG. 12 is a top view of a light-emitting device according to Embodiment 2.

Next, with reference to FIG. 12, a light-emitting device 40 according to Embodiment 2 will be described. FIG. 12 is a top view of the light-emitting device 40 according to Embodiment 2.

The light-emitting device 40 is different from the light-emitting device 10 according to Embodiment 1 in the configurations of the first insulating layer 17, the first electrode pad 23, and the second electrode pad 24, and similar to Embodiment 1 in the other points. In the following description, the differences from Embodiment 1 will be mainly described.
First Insulating Layer 17

The first insulating layer 17 is provided with an opening OP3 that exposes a p-side electrode PE formed on an upper surface of a p-type semiconductor layer 16 of a light-emitting element 13A by less than half of the length in the longitudinal direction of the p-side electrode PE. In this embodiment, the opening OP3 extends from a side of one of a pair of mutually opposed sides 12X of the substrate 12 to the vicinity of the center along the longitudinal direction of the p-side electrode PE. In other words, the opening OP3 extends from one end in the short side direction of the p-side electrode PE so as to expose the p-side electrode PE half-way.

The first insulating layer 17 is provided with an opening OP4 that exposes an n-side electrode NE formed on an upper surface of a lower portion 14A of an n-type semiconductor layer 14 of a light-emitting element 13E by less than half of the length in the longitudinal direction of the n-side elec-trode NE. In this embodiment, the opening OP4 extends from the side of the other of the pair of mutually opposed sides 12X of the substrate 12 to the vicinity of the center along the longitudinal direction of the n-side electrode NE. In other words, the opening OP4 extends from one end in the short side direction of the n-side electrode NE so as to expose the n-side electrode NE halfway.
First Electrode Pad The first electrode pad 23 is an electrode pad formed to cover the p-side electrode PE exposed from the opening OP3 on the light-emitting element 13A. The first electrode pad 23 covers the opening OP3 on the light-emitting element 13A, and is formed from the upper surface of the first insulating layer 17 covering the light-emitting element 13A to the upper surface of the first insulating layer 17 covering the light-emitting element 13E.

In this embodiment, the first electrode pad 23 is an electrode pad having the upper surface in a rectangular shape in which a direction along the side 12Y of the substrate 12 is a short side direction and the first electrode pad 23 is adjacent to and along the one of the pair of the sides 12X of the substrate 12.
Second Electrode Pad The second electrode pad 24 is an electrode pad formed to be spaced from the first electrode pad 23 so as cover the n-side electrode NE exposed from the opening OP4 on the light-emitting element 13E. The second electrode pad 24 covers the opening OP4 on the light-emitting element 13E, and is formed from the upper surface of the first insulating layer 17 covering the light-emitting element 13E to the upper surface of the first insulating layer 17 covering the light-emitting element 13A.

In this embodiment, the second electrode pad 24 is an electrode pad having the upper surface in a rectangular shape in which a direction along the side 12Y of the substrate 12 is a short side direction and the second electrode pad 24 is adjacent to and along the other of the pair of the sides 12X of the substrate 12.

Thus, in this embodiment, the first electrode pad 23 and the second electrode pad 24 are each disposed over the light-emitting elements 13A to 13E so as to have the longitudinal direction in the arranging direction (X-direc-tion) of the light-emitting elements 13A to 13E, in other words, so as to be perpendicular to the longitudinal direction (Y-direction) of the light-emitting elements 13A to 13E.

Accordingly, even when the side 12Y (front-back direc-tion) is longer than the side 12X (right-left direction) of the substrate 12, the first electrode pad 23 and the second electrode pad 24 can be longitudinally disposed in the direction of the side 12Y, and this allows stable mounting to a circuit board. For example, the phenomenon of standing upside-down can be suppressed, and a short circuit can be suppressed by increasing a distance between the electrode pads. While the contact length between the first electrode pad 23 and the p-side electrode PE and the contact length between the second electrode pad 24 and the n-side elec-trode NE are decreased compared with Embodiment 1, the contact lengths of the p-side electrode PE and the n-side electrode NE with the p-type semiconductor layer 16 and the n-type semiconductor layer 14 are the same as those in Embodiment 1. Therefore, the current can be flowed to each of the light-emitting elements 13A to 13E so as to be balanced.

According to this embodiment, similarly to Embodiment 1, the light-emitting device 40 includes a plurality of ele-ments as a light-emitting device and allows a uniform distribution of a current flowing in each of the light-emitting elements 13A to 13E.

Various numerical values, dimensions, materials, and the like in the embodiments and the modifications described above are merely examples, and can be appropriately selected depending on the usage and the light-emitting device to be manufactured. For example, the number of the light-emitting elements disposed on one substrate can be appropriately selected as 3, 5, 7, . . . corresponding to the required drive voltage. For example, groups of the light-emitting elements connected in series in a strip shape can be disposed in a plurality of rows (in parallel).

It is understood that the foregoing description and accom-panying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. The present application is based upon and claims the benefit of priority from the prior Japanese Patent Application No. 2022-83626 filed on May 23, 2022, the entire contents of which are incorporated herein by reference.

What is claimed is:

1. A semiconductor light-emitting device comprising:
a translucent substrate;
a plurality of light-emitting elements disposed in a row on the translucent substrate, each of the plurality of light-emitting elements including a first semiconductor layer, a light-emitting layer, a second semiconductor layer, a first electrode, and a second electrode, the first semiconductor layer being formed on the translucent substrate and having a first conductivity type, the light-emitting layer being formed on the first semiconductor layer, the second semiconductor layer being formed on the light-emitting layer and having a second conductivity type opposite to the first conductivity type, the first electrode being formed on the first semiconductor layer, and the second electrode being formed on the second semiconductor layer;
an insulating layer that covers the plurality of light-emitting elements on the translucent substrate so as to form a first opening and a second opening, the first opening exposing the first electrode of the light-emitting element in one end side of the row among the plurality of light-emitting elements, and the second opening exposing the second electrode of the light-emitting element in another end side of the row among the plurality of light-emitting elements;
a first electrode pad covering the first opening and being formed from the first opening over one region on the insulating layer, the first electrode pad being electrically connected to the first electrode; and
a second electrode pad covering the second opening and being formed from the second opening over another region spaced from the one region on the insulating layer, the second electrode pad being electrically connected to the second electrode,
wherein each of the plurality of light-emitting elements has an upper surface in a rectangular shape in which a direction along the row is a short side direction, and the first electrode and the second electrode extend along a longitudinal direction of each of the plurality of light-emitting elements.

2. The semiconductor light-emitting device according to claim 1, further comprising a plurality of transition wirings each formed from the first electrode of one light-emitting element to the second electrode of another light-emitting element of the light-emitting elements adjacent along the row, each of the plurality of transition wirings being covered with the insulating layer.

3. The semiconductor light-emitting device according to claim 2, wherein the plurality of transition wirings connect between the plurality of light-emitting elements in series, and the plurality of transition wirings extend along the respective longitudinal directions of the plurality of light-emitting elements.

4. The semiconductor light-emitting device according to claim 1, wherein the first opening and the second opening are formed over sides in the longitudinal direction of the upper surfaces of the plurality of light-emitting elements.

5. The semiconductor light-emitting device according to claim 1, wherein the first opening extends from one end of the side in the longitudinal direction halfway on the side in the longitudinal direction, the second opening extends from another end of the side in the longitudinal direction halfway on the side in the longitudinal direction, and the first electrode pad and the second electrode pad are disposed over the plurality of light-emitting elements along the row.

6. The semiconductor light-emitting device according to claim 1, wherein in each of the plurality of light-emitting elements, the first semiconductor layer has a lower portion and an upper portion projecting upward from an upper surface of the lower portion, and the first electrode is formed in a region on the upper surface of the lower portion excluding a region in which the upper portion is formed.

7. The semiconductor light-emitting device according to claim 1, wherein the first electrode pad and the second electrode pad are mutually spaced at a predetermined interval.

8. The semiconductor light-emitting device according to claim 1, wherein each of the first electrode pad and the second electrode pad contains Al.

9. A light-emitting module device comprising:
the semiconductor light-emitting device according to claim 1; and
a wavelength conversion member disposed on a light-exiting surface of the semiconductor light-emitting device,
wherein:
the light-exiting surface is a surface of the translucent substrate opposite to a surface thereof on which the first semiconductor layer is formed, and
the wavelength conversion member continuously extends across a region opposed to a formation region of the plurality of light-emitting elements.

10. The light-emitting module device according to claim 9, wherein:
the wavelength conversion member is bonded to the light-exiting surface via a translucent adhesive layer,
the light-emitting module device further includes a light shielding layer, and
the light shielding layer covers sides of the semiconductor light-emitting device, sides of the translucent adhesive layer, and sides of the wavelength conversion member.

11. The light-emitting module device according to claim 10, wherein:
the light shielding layer comprises a reflective resin material, and
the reflective resin material reflects a light emitted from the semiconductor light-emitting device and a light wavelength-converted from the light emitted from the semiconductor light-emitting device within the wavelength conversion member.

* * * * *